(12) United States Patent
Yu et al.

(10) Patent No.: US 11,632,108 B2
(45) Date of Patent: *Apr. 18, 2023

(54) TECHNIQUES FOR MULTIPLE SIGNAL FAN-OUT

(71) Applicant: Intel Corporation, Santa Clara, CA (US)

(72) Inventors: Chuanzhao Yu, Phoenix, AZ (US); Stephan Leuschner, Munich (DE); David Newman, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/669,762

(22) Filed: Feb. 11, 2022

(65) Prior Publication Data

US 2022/0166430 A1 May 26, 2022

Related U.S. Application Data

(62) Division of application No. 16/766,843, filed as application No. PCT/US2018/024931 on Mar. 28, 2018, now Pat. No. 11,283,444.

(51) Int. Cl.
*H03K 17/693* (2006.01)
*H03H 7/42* (2006.01)
(Continued)

(52) U.S. Cl.
CPC ............ *H03K 17/693* (2013.01); *H03H 7/42* (2013.01); *H03K 17/063* (2013.01); *H03K 17/162* (2013.01)

(58) Field of Classification Search
None
See application file for complete search history.

(56) References Cited

U.S. PATENT DOCUMENTS 4,920,284 A * 4/1990 Denda .............. H03K 3/356017
326/74
5,892,400 A * 4/1999 van Saders ............ H03K 3/354
330/296

(Continued)

FOREIGN PATENT DOCUMENTS

DE 112018007364 T5 12/2020
WO WO-2019190507 A1 10/2019

OTHER PUBLICATIONS

"U.S. Appl. No. 16/766,843, Final Office Action dated Aug. 19, 2021", 9 pgs.

(Continued)

*Primary Examiner* — Thomas J. Hiltunen
(74) *Attorney, Agent, or Firm* — Schwegman Lundberg & Woessner, P.A.

(57) ABSTRACT

Techniques are provided for fanning out a signal from a balun. In various aspects, the system can include a balun configured to receive a signal for transmission at an input and to provide a representation of the signal at an output, a plurality of pass gate circuits, each pass gate circuit configured to receive the representation of the signal at a first node, to receive a control signal at a second node to pass the representation of the signal to a third node when the control signal is in a first state, and to isolate the representation of the signal from the third node when the control signal is in a second state. The first state of the control signal can include a non-zero voltage, and the second state of the control signal can include the non-zero voltage with a polarity opposite the non-zero voltage of the first state.

6 Claims, 8 Drawing Sheets

(51) Int. Cl.
*H03K 17/06* (2006.01)
*H03K 17/16* (2006.01)

(56) References Cited

U.S. PATENT DOCUMENTS

| | | | |
|---|---|---|---|
| 6,107,857 A * | 8/2000 | Orisaka | H03K 19/018521 |
| | | | 326/62 |
| 6,242,962 B1 | 6/2001 | Nakamura | |
| 6,404,230 B1 | 6/2002 | Cairns et al. | |
| 7,560,971 B2 * | 7/2009 | Heikkila | H03K 19/018521 |
| | | | 327/333 |
| 7,705,630 B1 | 4/2010 | Huang et al. | |
| 8,618,786 B1 * | 12/2013 | Perisetty | G11C 11/417 |
| | | | 365/189.09 |
| 9,294,050 B2 | 3/2016 | Mostov et al. | |
| 9,667,255 B2 | 5/2017 | Englekirk | |
| 9,948,289 B2 * | 4/2018 | Leong | H03K 17/163 |
| 10,103,726 B2 | 10/2018 | Wilz et al. | |
| 10,580,892 B2 * | 3/2020 | Achiriloaie | H03F 1/0266 |
| 10,931,193 B2 | 2/2021 | Tokuda et al. | |
| 11,283,444 B2 * | 3/2022 | Yu | H03K 19/018528 |
| 11,394,288 B2 * | 7/2022 | Nakakohara | H02M 3/158 |
| 2006/0044019 A1 | 3/2006 | Graves | |
| 2006/0197579 A1 | 9/2006 | Kanno et al. | |
| 2009/0212841 A1 | 8/2009 | Chu et al. | |
| 2010/0029227 A1 | 2/2010 | Narathong et al. | |
| 2014/0049311 A1 | 2/2014 | Yang et al. | |
| 2015/0263731 A1 * | 9/2015 | Kushiyama | H03K 19/017 |
| | | | 327/333 |
| 2016/0380632 A1 | 12/2016 | Crandall | |
| 2020/0313662 A1 | 10/2020 | Chen | |
| 2020/0321956 A1 | 10/2020 | Yu et al. | |

OTHER PUBLICATIONS

"U.S. Appl. No. 16/766,843, Non Final Office Action dated May 5, 2021", 8 pgs.
"U.S. Appl. No. 16/766,843, Non Final Office Action dated Oct. 16, 2020", 16 pgs.
"U.S. Appl. No. 16/766,843, Notice of Allowance dated Nov. 17, 2021", 8 pgs.
"U.S. Appl. No. 16/766,843, Response filed Jan. 15, 2021 to Non Final Office Action dated Oct. 16, 2020", 6 pgs.
"U.S. Appl. No. 16/766,843, Response filed Aug. 5, 2021 to Non Final Office Action dated May 5, 2021", 8 pgs.
"U.S. Appl. No. 16/766,843, Response filed Oct. 19, 2021 to Final Office Action dated Aug. 19, 2021", 8 pgs.
"International Application Serial No. PCT/US2018/024931, International Preliminary Report on Patentability dated Oct. 8, 2020", 19 pgs.
"International Application Serial No. PCT/US2018/024931, International Search Report dated Jan. 3, 2019", 4 pgs.
"International Application Serial No. PCT/US2018/024931, Written Opinion dated Jan. 3, 2019", 17 pgs.

* cited by examiner

TECHNIQUES FOR MULTIPLE SIGNAL FAN-OUT

This patent application is a divisional of U.S. patent application Ser. No. 16/766,843, filed May 26, 2020, which is a U.S. National Stage Filing under 35 U.S.C. 371 from International Application No. PCT/US2018/024931, filed Mar. 28, 2018 and published in English as WO 2019/190507 on Oct. 3, 2019, each of which is hereby incorporated by reference herein in its entirety.

TECHNICAL FIELD

This document pertains generally, but not by way of limitation, to signal switching, and more particularly to switching a signal from a common source to a selected output of multiple possible outputs.

BACKGROUND

Multiple input multiple output (MIMO) communication devices are beginning to become practical consumer products. However, challenges remain with how to efficiently configure the devices while at the same time minimize interference between, for example, output communication channels or between an output channel and one or more of the input channels.

BRIEF DESCRIPTION OF THE DRAWINGS

In the drawings, which are not necessarily drawn to scale, like numerals may describe similar components in different views. Like numerals having different letter suffixes may represent different instances of similar components. Some aspects are illustrated by way of example, and not limitation, in the figures of the accompanying drawings in which.

DETAILED DESCRIPTION

The following description and the drawings sufficiently illustrate specific aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

One solution for efficiently packaging at least a multiple output type communication system is to use a common balun and fan the balun output signal via switches to a desired power amplifier for transmission. Isolating a non-selected power amplifier from the balun output can be an issue especially when the supply voltage is quite low, for example, in the range of 1.2 volts. An appropriate switch circuit should have low insertion loss for the "on" or selected state, and high isolation for the "off" or unselected state.

Figure 1:
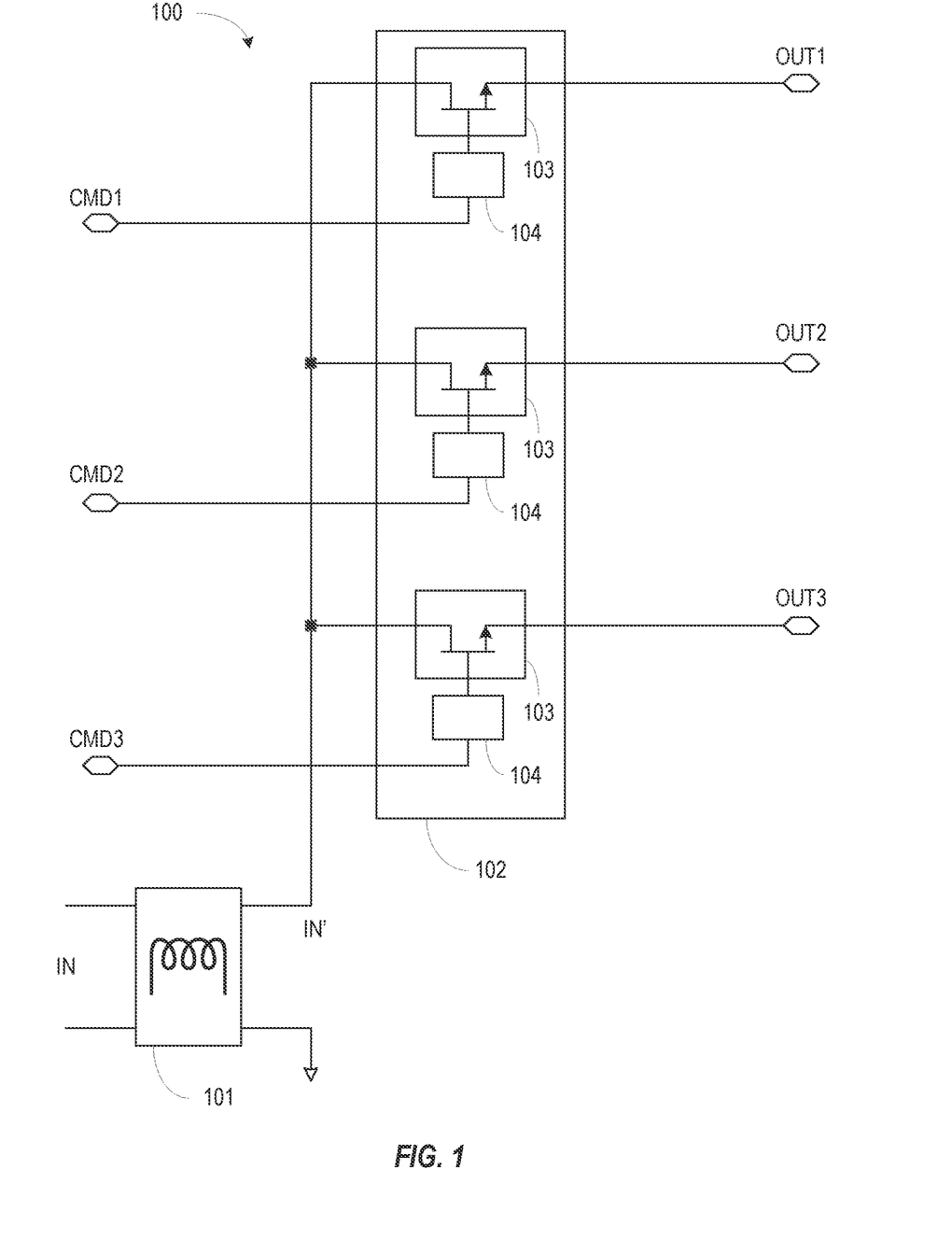
FIG. 1 illustrates generally a portion of an example multiple output transmitter circuit according to aspects of the present subject matter.

FIG. 1 illustrates generally a portion of an example multiple output transmitter circuit 100 according to the present subject matter. The circuit 100 can include a balun 101 and a selection circuit 102. The balun 101 can receive a signal (IN) for transmitting one of several outputs (OUT1, OUT2, OUT3) and can convert the signal (IN) for example from a differential signal (IN) to a single ended signal (IN'). In certain aspects, the signal (IN, IN') can include a radio frequency (RF) signal for wireless transmission. The selection circuit 102 can receive command signals (CMD1, CMD2, CMD3) and, in response, select one of multiple pass gate circuits 103 to pass the signal to, for example, a power amplifier (not shown) for transmission over a selected medium according to a selected protocol. In certain aspects, the command signals (CMD1, CMD2, CMD3) can provide one of two voltage states to operate a transistor of the selection circuit 102. In an aspect, a command signal configured to turn the transistor "on" or to allow the output of balun 101 to pass to an output of the selection circuit, can have a high logic voltage level. In the same example, the command signal configured to turn the transistor "off" or to allow the transistor to isolate the output of the balun 101 from an output of the selection circuit, can have a low logic voltage level. In certain aspects, the high logic voltage level can be about 1.2 volts or between 1 volt and about 1.4 volts, and the low logic voltage level can be about 0 volts. In some examples, the high and low logic levels can be the opposite of that discussed above without departing from the scope of the present subject matter.

However, the present inventors have recognized that directly operating a transistor using the above logic levels can allow distortion when a channel is selected, and may not perform robustly in isolating a non-selected output when a channel is not selected. To solve these issues, the inventors have recognized a selection circuit 102 that can include a negative level shift circuit 104 and a more robust pass gate circuit 103 for each output (OUT1, OUT2, OUT3).

Figure 2:
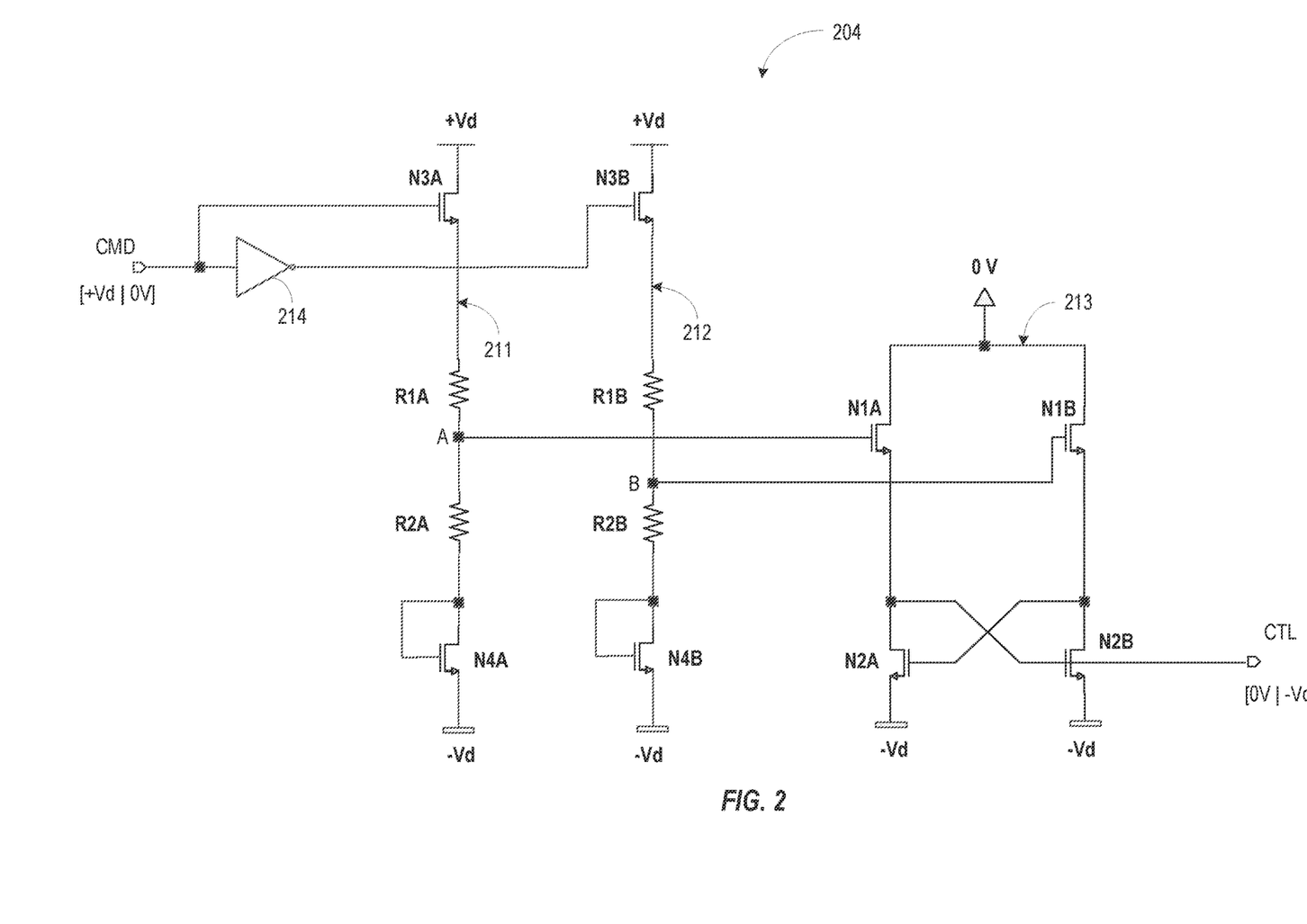
FIG. 2 illustrates generally an example negative level shift circuit according to aspects of the present subject matter.

FIG. 2 illustrates generally an example negative level shift circuit 204 according to the present subject matter. The negative level shift circuit 204 can include a positive voltage supply (+Vd), a negative voltage supply (−Vd), a first selectable voltage divider 211, a second selectable voltage divider 212, and a cross coupled transistor or comparator circuit 213. In certain aspects, each voltage divider 211, 212 can include a pair of resistors (R1, R2) selectively coupled in series between the positive voltage supply (+Vd) and the negative voltage supply (−Vd). In some examples, a diode or diode connected transistor (N4) can couple the voltage divider 211, 212 with the negative voltage supply (−Vd). Each voltage divider 211, 212 can include a corresponding switch (N3A, N3B) to couple the voltage divider 211, 212 with the positive voltage supply (+Vd). A control node of the switch (N3A) of the first voltage divider 211 can be coupled to an input (CMD) of the negative level shifter 204. A control node of the switch (N3B) of the second voltage divider 212 can be coupled to an output of an inverter 214. In certain aspects, the inverter can be powered via the positive voltage supply (+Vd) and ground, or 0 Volts. The input of the negative level shift circuit 204 can receive a command signal (CMD) as discussed above. The inverter 214 can receive the command signal (CMD) and can provide an inverted representation of the command signal (CMD). In certain aspects, the command signal (CMD) can have a voltage level of about 1.2 volts in a first state and about 0 volts in a second state.

The comparator circuit 213 can receive outputs from the first and second voltage dividers 211, 212 and can provide a level shifted output signal (CTL). The comparator circuit 213 can have a pair of cross-coupled transistors (N2A, N2B) each referenced to the negative voltage supply (−Vd). The control terminal of each of the cross-coupled transistors (N2A, N2B) can be coupled to a terminal of the other cross-coupled transistor. Each of the cross-coupled transistors (N2A, N2B) can be coupled to ground using a corresponding input transistor (N1A, N1B). A control node of each input transistor (N1A, N1B) of the comparator circuit 213 can receive a signal from an intermediate node (A, B) of one of the selectable voltage dividers 211, 212.

In general, when a command signal (CMD) at the input of the negative level shift circuit 204 is in a first state with a voltage level near the positive supply voltage level (+Vd), the negative level shift circuit 204 can provide an output signal (CTL) in a first state with a voltage level near zero volts. When the command signal (CMD) at the input of the negative level shift circuit 204 is in a second state with a voltage near 0 volts, the negative level shift circuit 204 can provide an output signal (CTL) in a second state with a voltage level near the negative supply voltage level (−Vd).

For example, when the command signal (CMD) at the input of the negative level shift circuit 204 is in a first state with a voltage level near the positive supply voltage level (+Vd), the first voltage divider 211 can be coupled to the positive voltage supply (+Vd) and the second voltage divider 212 can be isolated from the positive voltage supply (+Vd). In certain aspects, the voltage divider resistors (R3, R4) are large and equal to each other such that very little current flows through the voltage dividers 211, 212 when coupled to the positive voltage supply (+Vd). The switches (N3A, N3B) of each voltage divider 211, 212 are configured to act as a source follower. With the command input at +Vd, the source node of the switch (N3A) of the first voltage divider 211 can be at (+Vd−$v_t$), and the source node of the switch (N3B) of the second voltage divider 211 can be at 0−$v_t$, where $v_t$ is the threshold voltage of the switch junction. The intermediate nodes (A, B) of each of the voltage dividers can be expressed as, $$V_A = \frac{(+V_d - v_t) + (-V_d + v_t)}{2} = 0,$$
$$V_B = \frac{(0 - v_t) + (-V_d + v_t)}{2} = \frac{-V_d}{2},$$

The voltage of node A and B can be independent of the NMOS device threshold voltage, which can vary with process and temperature. The mild voltages ($V_A$=0 V and $V_B$=−0.6 V when CMD=+1.2V) keeps all the devices—N3, N4, N1A, N1B under non-rail-to-rail biases. Thus, the devices are under reliable operation range (not over-stressed). Transistors N1A, N1B, and N2A, N2B can form the comparator circuit 213 with 0 V as high supply and −$V_d$ as low supply. The comparator circuit 213 output (CTL) can be 0 V (high supply) with 0V for node A and −$V_d$ for node B when the input signal (CMD) is at +$V_d$.

When the input signal (CMD) is in the second state (e.g., ~0 Volts), $$V_A = \frac{(+V_d - v_t) + (-V_d + v_t)}{2} = \frac{-V_d}{2},$$
$$V_B = \frac{(0 - v_t) + (-V_d + v_t)}{2} = 0,$$

With the above values of nodes A and B, the comparator circuit 213 output (CTL) can be at −$V_d$ (low supply).

Figure 3:
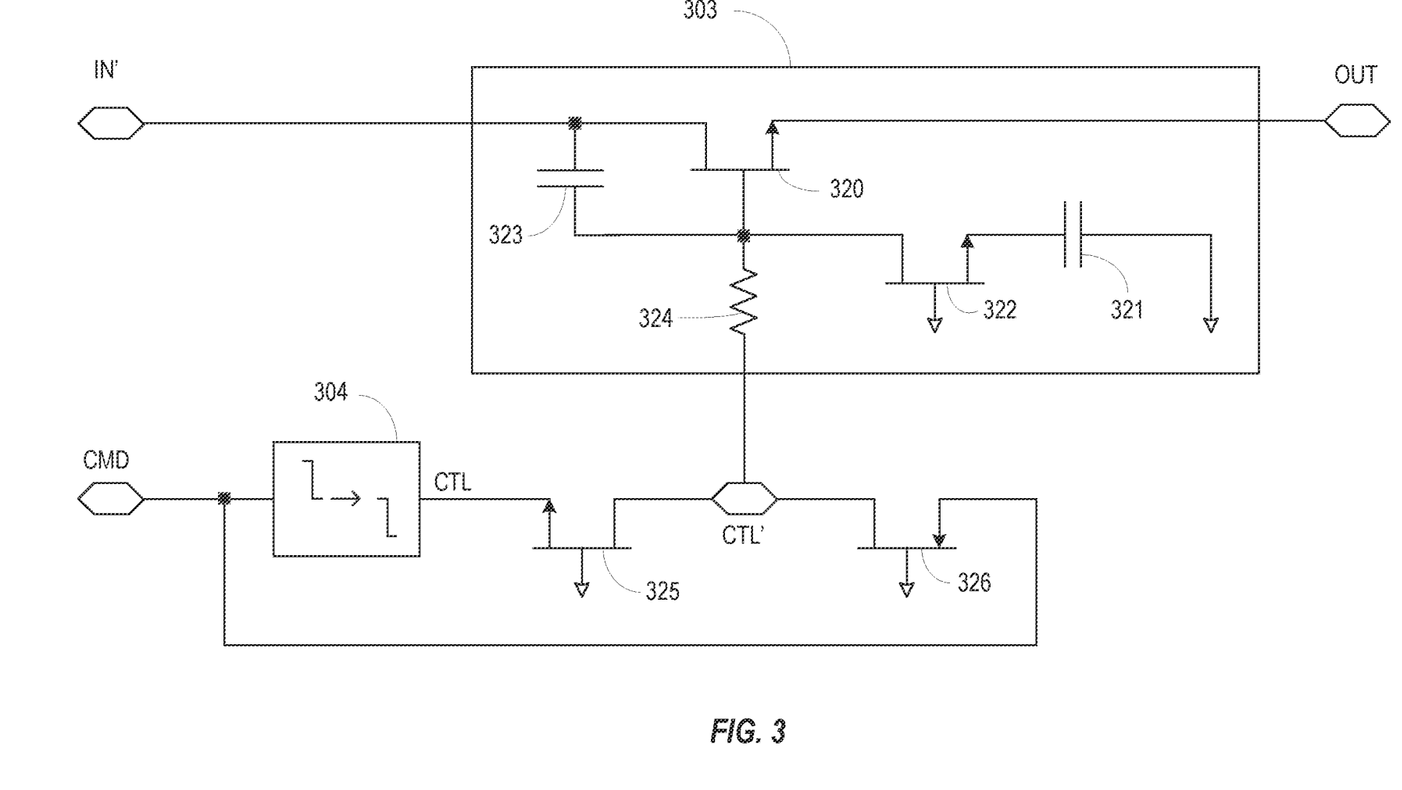
FIG. 3 illustrates generally single channel of a transmitter circuit including an example negative level shift circuit and an example pass gate circuit in accordance with aspects of the present subject matter.

FIG. 3 illustrates generally single channel of a transmitter circuit 300 including an example negative level shift circuit 304 and an example pass gate circuit 303 in accordance with the present subject matter. The pass gate circuit 303 can include a pass gate transistor 320, an auto switched capacitor 321 coupled to the control node of the pass gate transistor 320 via a second transistor 322, a second capacitor 323 coupled between the input node of the pass gate transistor 320 and the control node of the pass gate transistor 320. In certain aspects, a control signal (CTL') of the pass gate transistor 320 can be received at the control node of the pass gate transistor 320 via an isolation element such as a resistor 324. As discussed above, the negative level shift circuit 304 can provide an output control signal (CTL) at 0 volts when the channel is to be enabled, and −Vdd when the channel is to be disabled.

The negative level shift circuit 304 can be coupled to the control node of the pass gate circuit 303 using a third transistor 325. A fourth transistor 326 can receive the command signal (CMD) and can be coupled between the input of the negative level shift circuit 304 and the control node of the pass gate circuit 303. In a first state of the command signal (CMD), when the channel is to be enabled, the command signal (CMD) can have a +Vdd voltage level, and the output (CMD) of the negative level shift circuit 304, can have a zero voltage level. The control node of each of the third and fourth transistors 325, 326 can be coupled to ground or zero volts. With the output (CMD) of the negative level shift circuit 304 at zero volts, the third transistor 325, an NMOS transistor, is "off" and acts as an open circuit between the output (CMD) of the negative level shift circuit 304 and the control node of the pass gate circuit 303. With the command signal (CMD) at +Vdd, the fourth transistor 326, a PMOS transistor, is "on", and applies the command signal voltage, +Vdd, to the control node (CTL') of the pass gate circuit 303.

In a second state of the command signal (CMD), when the channel is to be disabled, the command signal (CMD) can have a zero-voltage level, and the output (CTL) of the negative level shift circuit 304, can have a −Vdd voltage level. With the command signal (CMD) at zero volts, the fourth transistor 326, a PMOS transistor, is "off" and acts as an open circuit between the command signal (CMD) and the control node (CTL') of the pass gate circuit 303. With the output (CTL) of the negative level shift circuit 304 at −Vdd, the third transistor 325, an NMOS transistor, is "on", and can apply the voltage, −Vdd, of the output (CTL) of the negative level shift circuit 304 to the control node (CTL') of the pass gate circuit 303. Thus, the negative level shift circuit 304, in cooperation with the third and fourth transistors 325, 326, allows the control node (CTL') of the pass gate circuit 303 to be enabled with a +Vdd signal and disabled with a −Vdd signal.

Referring again to the pass gate circuit 303, when the control node (CTL') of the pass gate circuit 303 is at +Vdd, the second transistor 322, an NMOS transistor, is "off" and decouples the auto-switched capacitor 321 from the control node of the pass gate transistor 320. The +Vdd bias at the control node (CTL') of the pass gate circuit 303 can turn the pass gate transistor 320, an NMOS transistor, is "on" and can allow an RF signal, for example, to pass from the input (IN') of the pass gate circuit 303 to the output (OUT) of the pass gate circuit 303. The second capacitor 323 and isolation resistor 324 can allow the control node of the pass gate transistor 320 to maintain a consistent +Vdd bias above the received RF signal and thus maintain a consistent "on" bias and, in turn, a consistent "on" resistance, thus, ameliorating distortion due to the pass gate transistor 320.

When the control node of the pass gate circuit 303 is at −Vdd, the pass gate transistor 320 is "off" and can isolate the input (IN') of the pass gate circuit 303 from the output (OUT) of the pass gate circuit 303. In addition, the second transistor 322 can be "on" with the received −Vdd control signal and the auto-switched capacitor 321 can be coupled to the control node of the pass gate transistor 320 to mitigate the coupling effect of the second capacitor 323 and assure that the pass gate transistor 320 remains "off" even when an RF signal is received at the pass gate transistor 320 via the input (IN') to the pass-gate circuit 303.

Figure 4:
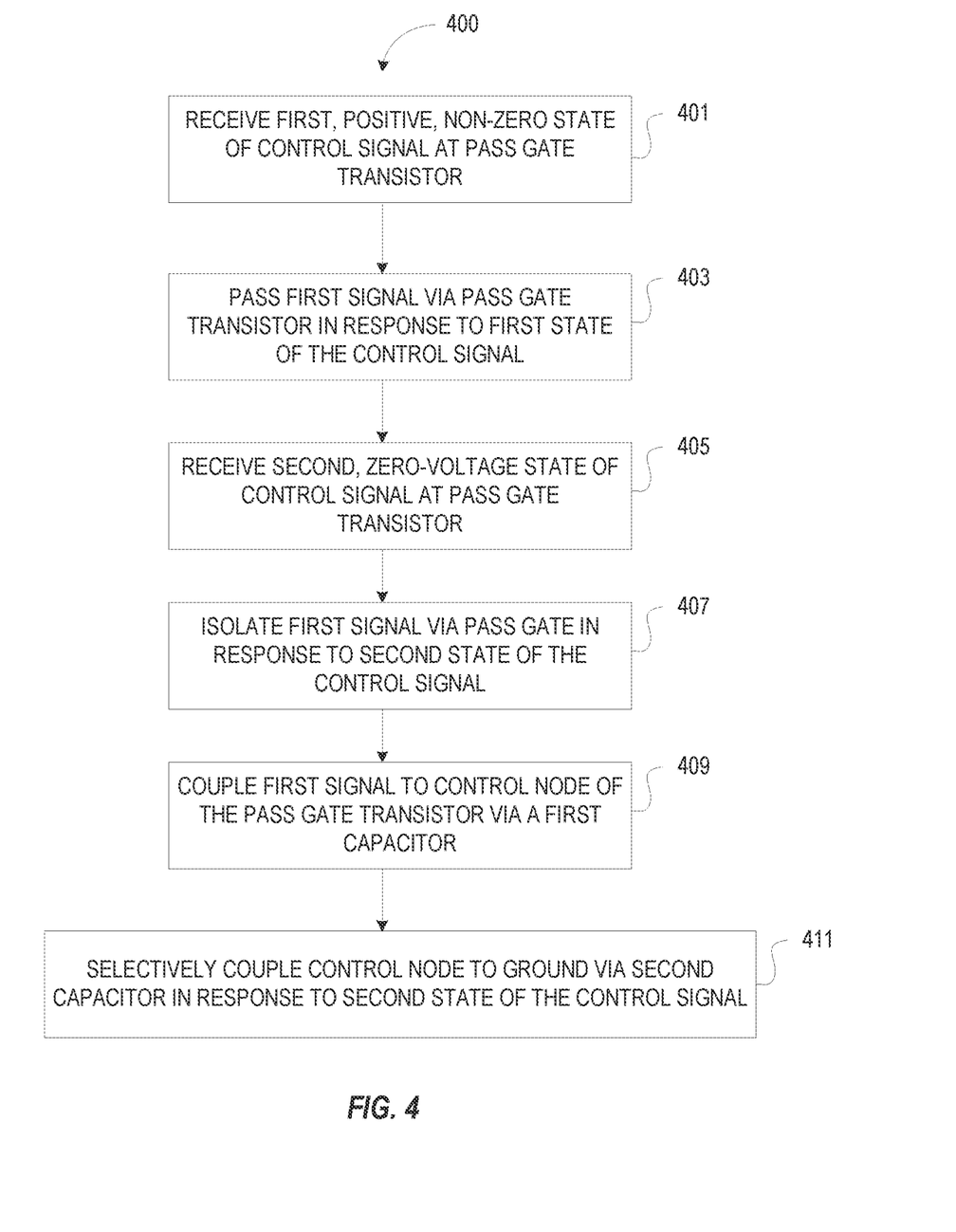
FIG. 4 illustrates generally a flowchart of an example method of operating a channel of a multi-channel RF transmitter circuit where a single RF conduction path can be fanned-out to multiple channels.

FIG. 4 illustrates generally a flowchart of an example method 400 of operating a channel of a multi-channel RF transmitter circuit where a single RF conduction path can be fanned-out to multiple channels. In certain aspects, a pass-gate circuit of each channel can selectively couple the single RF conduction path with a corresponding power amplifier of the channel. In certain aspects, each channel of the multiple channels can be associated with a transmission protocol that is different than another channel and an appropriate power amplifier to amplify and provide the signal in accordance with the protocol. At 401, a control signal in a first, positive, non-zero voltage state can be received at a control node of a pass gate transistor of the channel. At 403, a first signal can be passed from a first node of the pass gate transistor to a second node in response to the receiving the first state of the control signal. At 405, the control signal in a second, negative, non-zero voltage state can be received at the control node of the pass gate transistor. At 407, the first signal can be isolated from the second node in response to the receiving the second state of the control signal. In certain aspects, coupling the received signal with the control node of the pass gate transformer can help reduce distortion at the pass gate transistor by ensuring that the on-resistance of the pass gate transistor remains relatively constant. At 409, the first signal can be coupled to the control node using a first capacitor. In certain aspects, coupling the received signal with the control node of the pass gate transistor via a capacitor can help reduce distortion at the pass gate transistor by ensuring that the on-resistance of the pass gate transistor remains relatively constant. At 411, in response to receiving the second state of the control signal, the control node can be selectively coupled with ground via a second capacitor to mitigate effects of the coupling the first signal to the control node via the first capacitor. In certain aspects, the first capacitor can couple the received signal to the control node even when the channel is not selected to pass the received signal. Such coupling can turn the non-selected pass gate "on" under certain circumstances. As such, a second capacitor can be auto-coupled to the control node of the pass gate transistor when the channel is not selected to alleviate coupling effects of the first capacitor.

Figure 5:
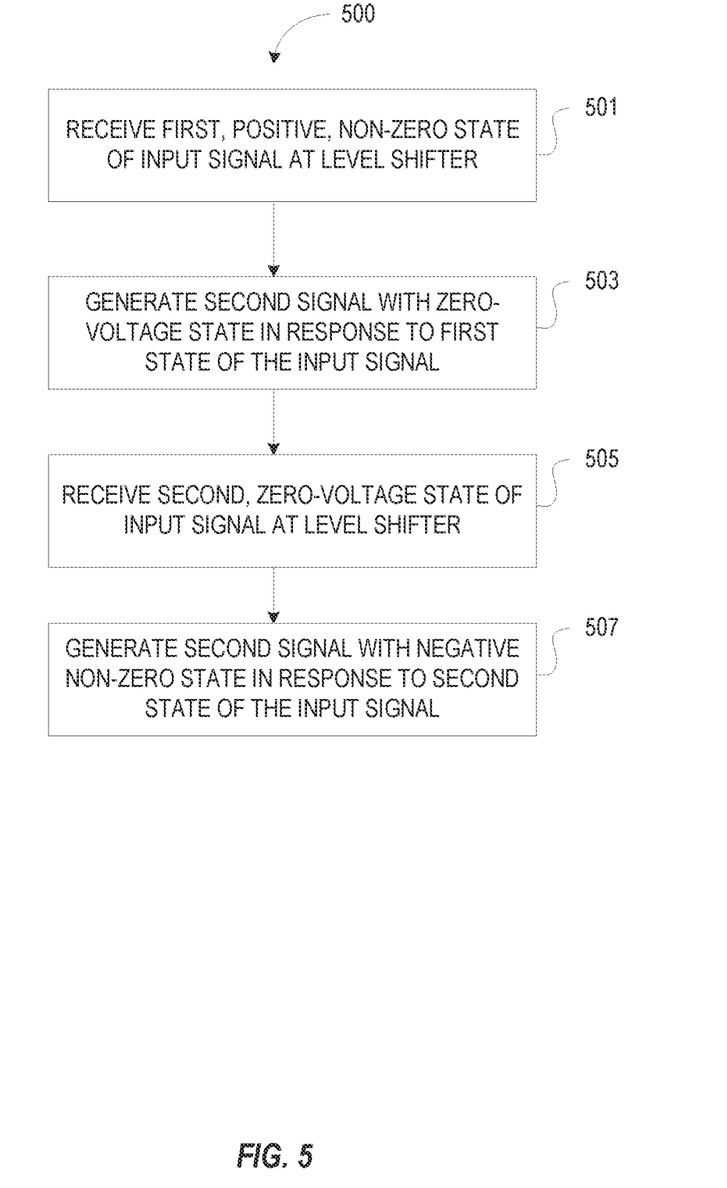
FIG. 5 illustrates generally a flowchart of an example method for negative level shifting an initial control signal that has a first, positive, non-zero voltage state and a second, zero-voltage state.

In certain aspects, an initial control signal such as a baseband control signal can be at least partially level shifted to assist in ensuring that channels not selected for passing the first signal do not pass the first signal. FIG. 5 illustrates generally a flowchart of an example method 500 for negative level shifting an initial control signal that has a first, positive, non-zero voltage state and a second, zero-voltage state. At 501, a first control signal, the initial control signal, in the first state can be received at a negative level shifter. At 503, a second control signal with a zero-voltage state can be generated in response to the first state of the first control signal. In certain aspects, a first voltage divider of two voltage dividers of the negative level shift circuit can be coupled to a positive supply voltage based on the first state of the first control signal. The second voltage divider can be isolated from the positive voltage supply. Intermediate nodes of the two voltage dividers can be compared using a comparator powered by a negative supply voltage referenced to zero volts. A 505, the first control signal in a second, zero-voltage state can be received at the negative level shifter. At 507, the second control signal can be generated with a negative, non-zero voltage state in response to the first control signal in the second, zero-voltage state. In response to receiving the second state of the first control signal, the second voltage divider can be coupled to the positive supply voltage while the first voltage divider is isolated from the positive supply voltage. As the intermediate nodes of the two voltage dividers can provide a voltage difference having a opposite polarity that provided when the first control signal was in the first state, the output of the comparator can swing to provide a negative non-zero voltage. As discussed above with reference to FIG. 3, additional transistors in cooperation with the negative level shifter can ensure that when the control node of the pass gate receives substantially the positive supply voltage when the first control signal is in the first state (e.g., channel selected), and receives the negative supply voltage when the first control signal is in the second state (e.g., channel not selected).

Figure 6:
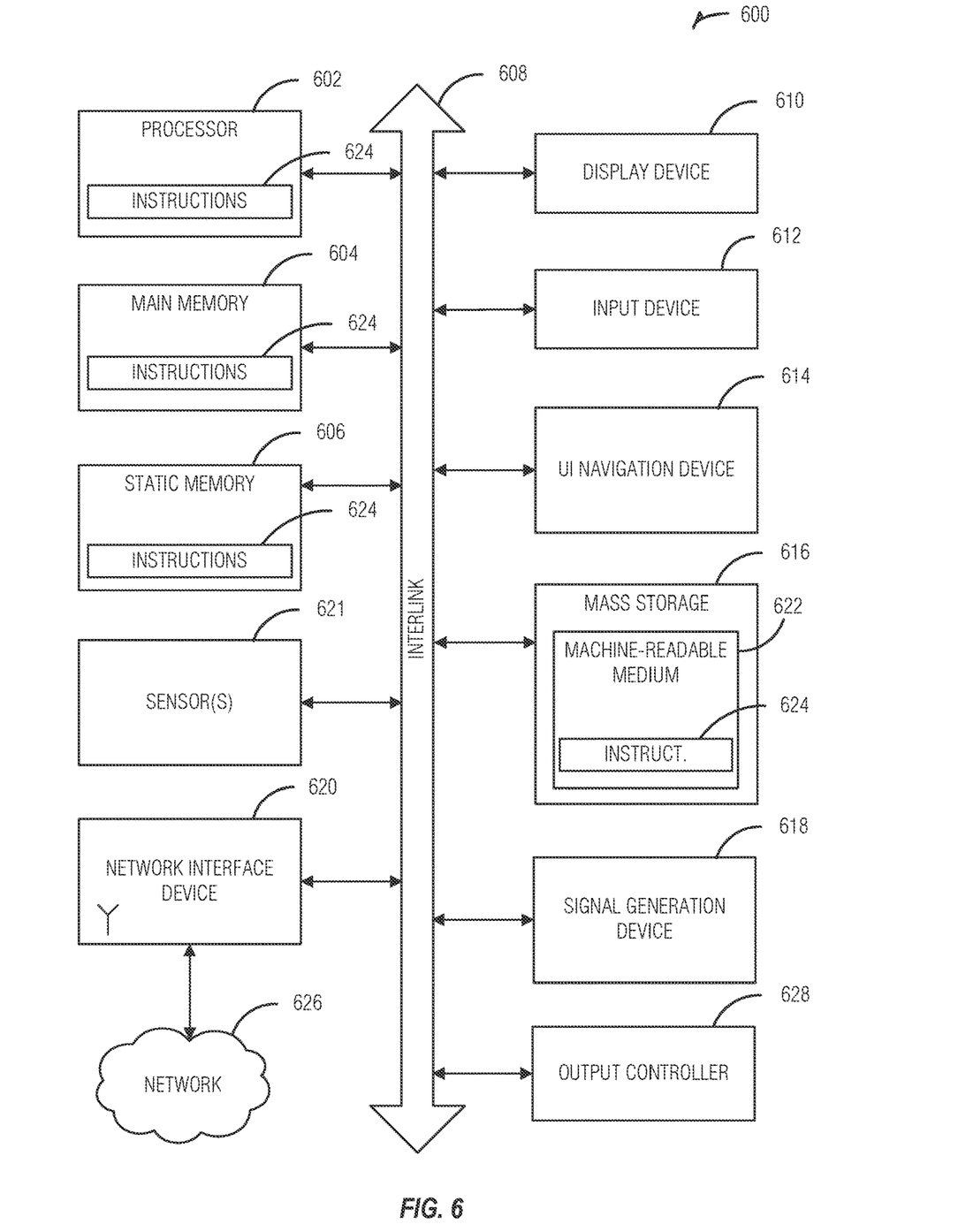
FIG. 6 illustrates a block diagram of an example machine upon which any one or more of the techniques (e.g., methodologies) discussed herein may perform.

FIG. 6 illustrates a block diagram of an example machine 600 upon which any one or more of the techniques (e.g., methodologies) discussed herein may perform. In alternative aspects, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (or other distributed) network environment. As used herein, peer-to-peer refers to a data link directly between two devices (e.g., it is not a hub-and spoke topology). Accordingly, peer-to-peer networking is networking to a set of machines using peer-to-peer data links. The machine 600 may be a single-board computer, an integrated circuit package, a system-on-a-chip (SOC), a personal computer (PC), a tablet PC, a set-top box (STB), a personal digital assistant (PDA), a mobile telephone, a web appliance, a network router, or other machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

Machine (e.g., computer system) 600 may include a hardware processor 602 (e.g., a central processing unit (CPU), a graphics processing unit (GPU), a hardware processor core, or any combination thereof), a main memory 604 and a static memory 606, some or all of which may communicate with each other via an interlink (e.g., bus) 608. The machine 600 may further include a display unit 610, an alphanumeric input device 612 (e.g., a keyboard), and a user interface (UI) navigation device 614 (e.g., a mouse). In an example, the display unit 610, input device 612 and UI navigation device 614 may be a touch screen display. The machine 600 may additionally include a storage device (e.g., drive unit) 616, a signal generation device 618 (e.g., a speaker), a network interface device 620, and one or more sensors 621, such as a global positioning system (GPS) sensor, compass, accelerometer, or other sensor. The machine 600 may include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 616 may include a machine readable medium 622 on which is stored one or more sets of data structures or instructions 624 (e.g., software) embodying or utilized by any one or more of the techniques or functions described herein. The instructions 624 may also reside, completely or at least partially, within the main memory 604, within static memory 606, or within the hardware processor 602 during execution thereof by the machine 600. In an example, one or any combination of the hardware processor 602, the main memory 604, the static memory 606, or the storage device 616 may constitute machine readable media.

While the machine readable medium 622 is illustrated as a single medium, the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software. In certain aspects, the network interface device can include a circuit as discussed above configured to fan-out a communication to one of multiple power amplifiers for transmitting the signal via a wired or wireless network.

Figure 7:
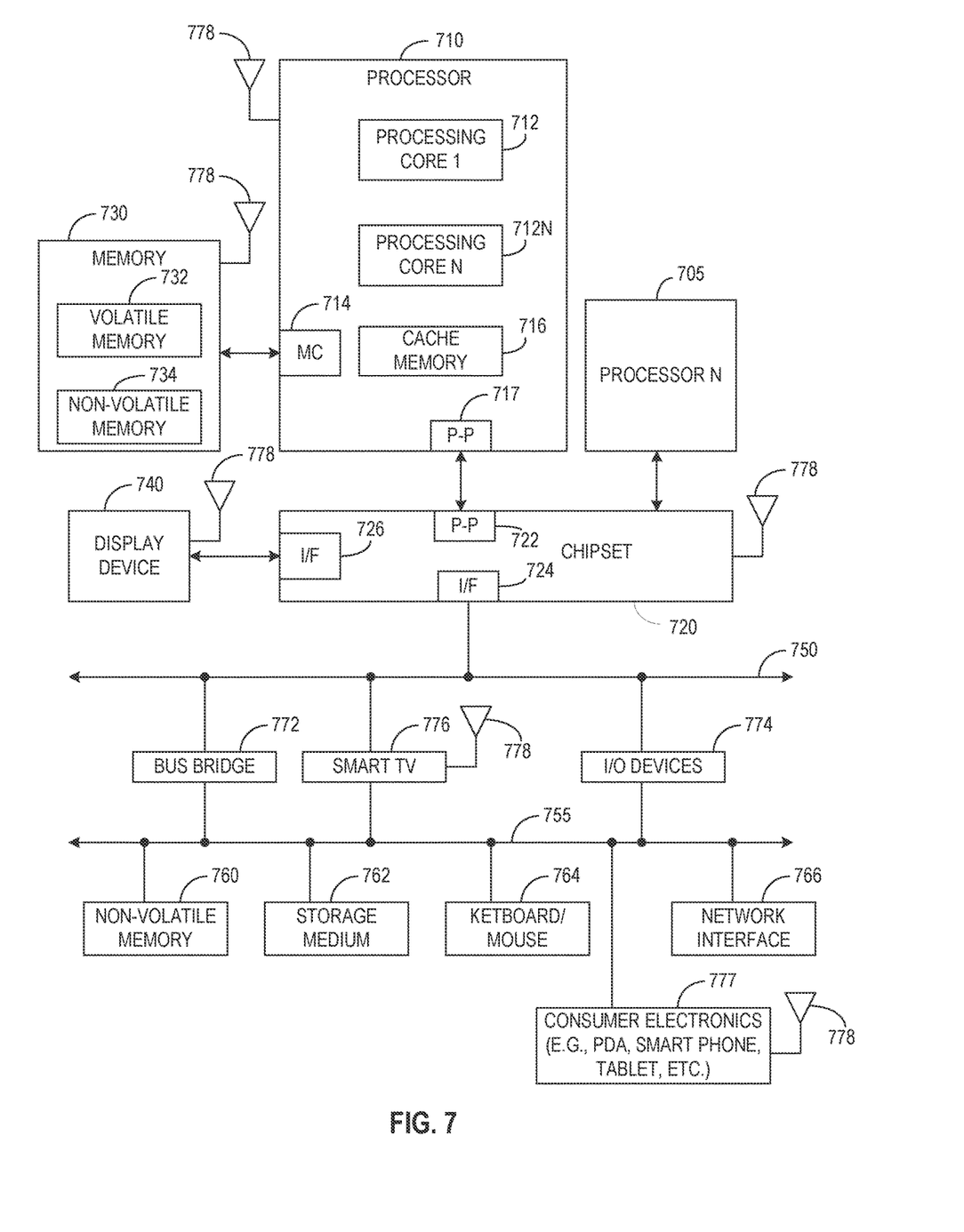
FIG. 7 illustrates a system level diagram, depicting an example of an electronic device (e.g., system) that can include, for example, a transmitter configured to selectively fan out a signal to one of multiple communication channels.

FIG. 7 illustrates a system level diagram, depicting an example of an electronic device (e.g., system) that can include, for example, a transmitter configured to selectively fan out a signal to one of multiple communication channels. FIG. 7 is included to show an example of a higher-level device application for the subject matter discussed above with regards to FIGS. 1-6. In one aspect, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some aspects, system 700 is a system on a chip (SOC) system.

In one aspect, processor 710 has one or more processor cores 712 and 712N, where 712N represents the Nth processor core inside processor 710 where N is a positive integer. In one aspect, system 700 includes multiple processors including 710 and 705, where processor 705 has logic similar or identical to the logic of processor 710. In some aspects, processing core 712 includes, but is not limited to, pre-fetch logic to fetch instructions, decode logic to decode the instructions, execution logic to execute instructions and the like. In some aspects, processor 710 has a cache memory 716 to cache instructions and/or data for system 700. Cache memory 716 may be organized into a hierarchal structure including one or more levels of cache memory.

In some aspects, processor 710 includes a memory controller 714, which is operable to perform functions that enable the processor 710 to access and communicate with memory 730 that includes a volatile memory 732 and/or a non-volatile memory 734. In some aspects, processor 710 is coupled with memory 730 and chipset 720. Processor 710 may also be coupled to a wireless antenna 778 to communicate with any device configured to transmit and/or receive wireless signals. In one aspect, an interface for wireless antenna 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some aspects, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one aspect, memory 730 may also store temporary variables or other intermediate information while processor 710 is executing instructions. In the illustrated aspect, chipset 720 connects with processor 710 via Point-to-Point (PtP or P-P) interfaces 717 and 722. Chipset 720 enables processor 710 to connect to other elements in system 700. In some aspects of the example system, interfaces 717 and 722 operate in accordance with a PtP communication protocol such as the Intel® QuickPath Interconnect (QPI) or the like. In other aspects, a different interconnect may be used.

In some aspects, chipset 720 is operable to communicate with processor 710, 705N, display device 740, and other devices, including a bus bridge 772, a smart TV 776, I/O devices 774, nonvolatile memory 760, a storage medium (such as one or more mass storage devices) 762, a keyboard/mouse 764, a network interface 766, and various forms of consumer electronics 777 (such as a PDA, smart phone, tablet etc.), etc. In one aspect, chipset 720 couples with these devices through an interface 724. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some aspects of the example system, processor 710 and chipset 720 are merged into a single SOC. In addition, chipset 720 connects to one or more buses 750 and 755 that interconnect various system elements, such as I/O devices 774, nonvolatile memory 760, storage medium 762, a keyboard/mouse 764, and network interface 766. Buses 750 and 755 may be interconnected together via a bus bridge 772.

In one aspect, mass storage device 762 includes, but is not limited to, a solid state drive, a hard disk drive, a universal serial bus flash memory drive, or any other form of computer data storage medium. In one aspect, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one aspect, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

Figure 8:
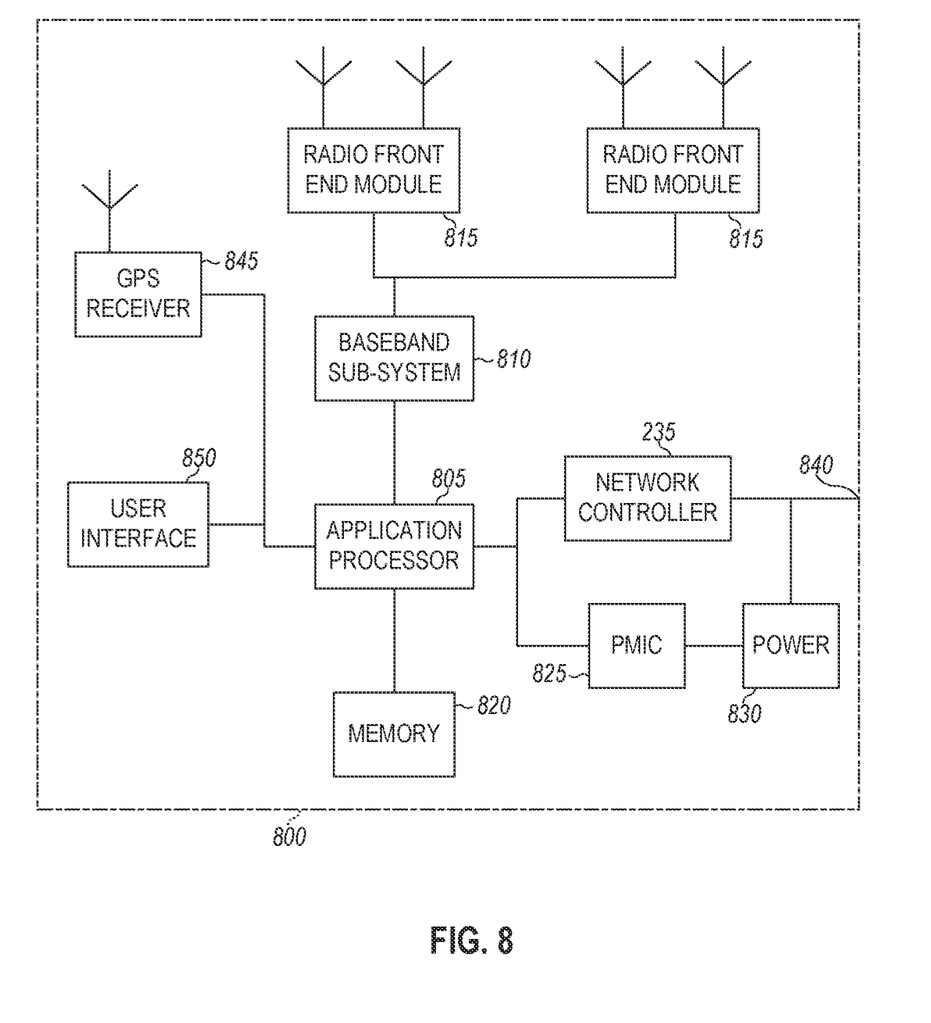
FIG. 8 illustrates an exemplary base station or infrastructure equipment radio head according to some aspects of the present subject matter.

FIG. 8 illustrates an exemplary base station or infrastructure equipment radio head according to some aspects. The base station radio head 800 may include one or more of application processor 805, baseband processors 810, one or more radio front end modules 815, memory 820, power management integrated circuitry (PMIC) 825, power tee circuitry 830, network controller 835, network interface connector 840, satellite navigation receiver (e.g., GPS receiver) 845, and user interface 850.

In some aspects, application processor 805 may include one or more CPU cores and one or more of cache memory, low drop-out voltage regulators (LDCs), interrupt controllers, serial interfaces such as SPI, I2C or universal programmable serial interface, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 810 may be implemented, for example, as a solder-down substrate including one or more integrated circuits, a single packaged integrated circuit soldered to a main circuit board or a multi-chip sub-system including two or more integrated circuits.

In some aspects, memory 820 may include one or more of volatile memory including dynamic random access memory (DRAM) and/or synchronous DRAM (SDRAM), and non-volatile memory (NVM) including high-speed electrically erasable memory (commonly referred to as Flash memory), phase-change random access memory (PRAM), magnetoresistive random access memory (MRAM), and/or a three-dimensional crosspoint memory. Memory 820 may be implemented as one or more of solder down packaged integrated circuits, socketed memory modules and plug-in memory cards.

In some aspects, power management integrated circuitry 825 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 830 may provide for electrical power drawn from a network cable. Power tee circuitry 830 may provide both power supply and data connectivity to the base station radio head 800 using a single cable.

In some aspects, network controller 835 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 845 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 845 may provide, to application processor 805, data which may include one or more of position data or time data. Time data may be used by application processor 805 to synchronize operations with other radio base stations or infrastructure equipment.

In some aspects, user interface 850 may include one or more of buttons. The buttons may include a reset button, User interface 850 may also include one or more indicators such as LEDs and a display screen.

ADDITIONAL NOTES

In a first aspect, Aspect 1, a system can include a transformer configured to receive a signal for transmission at an input and to provide a representation of the signal at an output; and a plurality of pass gate circuits coupled to the transformer, each pass gate circuit configured to receive the representation of the signal at a first node, to receive a control signal at a second node; to pass the representation of the signal to a third node when the control signal is in a first state; and to isolate the representation of the signal from the third node when the control signal is in a second state.

In Aspect 2, the first state of the control signal of aspect 1 optionally includes a non-zero voltage, and the second state of the control signal of Aspect 1 optionally includes the non-zero voltage with a polarity opposite the non-zero voltage of the first state.

In Aspect 3, a first pass gate circuit of the plurality of pass gates of any one or more of Aspects 1-2 optionally includes a first transistor, and the second node of the first pass gate circuit includes a control node of the first transistor.

In Aspect 4, the first pass gate circuit of any one or more of Aspects 1-3 optionally includes a second transistor, the second transistor having a control node, and first and second switch nodes. The first switch node of the second transistor can be coupled to the second node, and the control node of the second transistor can be coupled to a reference voltage. The reference voltage can have a value between the non-zero voltage of the first state and the non-zero voltage of the second state.

In Aspect 5, the first pass gate circuit any one or more of Aspects 1-4 optionally includes a first capacitor, the first capacitor coupled between the second switch node of the second transistor and the reference voltage.

In Aspect 6, the first pass gate circuit any one or more of Aspects 1-5 optionally includes a second capacitor coupled between the first node of the first pass gate circuit and the second node of the first pass gate circuit.

In Aspect 7, the transformer any one or more of Aspects 1-6 optionally is a single balun.

In Aspect 8, the balun any one or more of Aspects 1-7 optionally is a passive, unpowered balun.

In Aspect 9, the balun any one or more of Aspects 1-8 optionally is an active, powered balun.

In Aspect 10, The system of any one or more of Aspects 1-9 optionally includes a first level shift circuit configured to receive a first command signal and to provide the second state of the control signal to the second node of a first pass gate circuit of the plurality of pass gate circuits, the first command signal having a zero-voltage third state and a non-zero voltage fourth state.

In Aspect 11, the system of any one or more of Aspects 1-10 optionally includes a first switch configured to receive the command signal and provide the first state of the control signal to the second node of the first pass gate circuit In Aspect 12, the level shift circuit any one or more of Aspects 1-11 optionally includes a first voltage divider circuit, wherein a first end of the first voltage divider circuit is coupled to a negative voltage supply, a second voltage divider circuit, wherein a first end of the second voltage divider circuit is coupled to the negative voltage supply, a first switch configured to couple a second end of the first voltage divider to a positive supply voltage when the command signal is the non-zero fourth state, and a second switch configured to couple a second end of the second voltage divider to the positive supply voltage when the command signal is the zero-voltage third state.

In Aspect 13, the system of any one or more of Aspects 1-12 optionally includes a comparator having a first input coupled to an intermediate node of the first voltage divider circuit and a second input coupled to an intermediate node of the second voltage divider circuit, an output of the comparator configured to provide a reference voltage when the command signal is in the non-zero fourth state and to provide the negative supply voltage when the command signal is in the zero-voltage third state.

In Aspect 14, the first switch any one or more of Aspects 1-13 optionally is a first transistor having a control node configured to directly receive the command signal.

In Aspect 15, the system of any one or more of Aspects 1-14 optionally includes an inverter configured to receive the command signal.

In Aspect 16, the second switch any one or more of Aspects 1-15 optionally is a second transistor having a control coupled to an output of the inverter.

In Aspect 17, a pass gate circuit configured to pass a signal received at a first node to a second node when a control signal is in a first state, and to isolate the second node from the first node when the control signal is in a second state, can include a first transistor having a control node and first and second switch nodes, the control node configured to receive the control signal, the first node including the first switch node, and the second node including the second switch node, and a first capacitor selectively coupled between the control node and a reference voltage. The reference voltage can be less than a first voltage of the control signal in the first state and greater than a second voltage of the control signal in the second state.

In Aspect 18, the first voltage any one or more of Aspects 1-17 optionally is a non-zero voltage and the second voltage is the no-zero voltage with opposite polarity.

In Aspect 19, the first voltage any one or more of Aspects 1-18 optionally is about +1.2 Volts.

In Aspect 20, the pass gate circuit of any one or more of Aspects 1-19 optionally includes a second transistor having a first switch node coupled to the control node of the first transistor, a second switch node coupled to the first capacitor, and a control ode coupled to the reference voltage.

In Aspect 21, the second transistor any one or more of Aspects 1-20 optionally is an NMOS transistor.

In Aspect 22, the pass gate circuit of any one or more of Aspects 1-21 optionally includes a second capacitor coupled between the first node and the control node of the first transistor.

In Aspect 23, the first transistor any one or more of Aspects 1-22 optionally is an NMOS transistor.

In Aspect 24, a level-shift circuit can include a first voltage divider circuit, wherein a first end of the first voltage divider circuit is coupled to a negative voltage supply, a second voltage divider circuit, wherein a first end of the second voltage divider circuit is coupled to the negative voltage supply, a first switch configured to couple a second end of the first voltage divider to a positive supply voltage when a command signal is in a first state, and a second switch configured to couple a second end of the second voltage; divider to the positive supply voltage when the command signal is in a second state. The level shift circuit optionally is configured to receive the command signal. The command signal optionally includes a positive voltage first state and a zero-voltage second state. The level shift circuit optionally is configured to provide an output signal having a reference voltage third state responsive to the positive voltage first state, and a negative voltage fourth state responsive to the zero-voltage second state.

In Aspect 25, the level-shift circuit of any one or more of Aspects 1-24 optionally includes a third switch configured to receive the command signal and provide the reference voltage third state of the output signal.

In Aspect 26, the level-shift circuit of any one or more of Aspects 1-25 optionally includes a comparator. The comparator can include a first input coupled to an intermediate node of the first voltage divider circuit, a second input coupled to an intermediate node of the second voltage divider circuit, and an output configured to provide the output signal with the reference voltage third state when the command signal is in the first state, and to provide the output signal with the negative supply voltage when the command signal is in the zero-voltage second state.

In Aspect 27, the first switch any one or more of Aspects 1-26 optionally is a first transistor having a control node configured to directly receive the command signal.

In Aspect 28, the level-shift circuit of any one or more of Aspects 1-27 optionally includes an inverter configured to receive the command signal.

In Aspect 29, the second switch any one or more of Aspects 1-28 optionally is a second transistor having a control coupled to an output of the inverter.

In Aspect 30, a method for operating a negative level-shift circuit can include receiving a first control signal in a first, positive, non-zero voltage state, generating a second control signal with a zero voltage state in response to the first control signal in the positive first non-zero state, receiving the first control signal in a second, zero-voltage state, and generating the second control signal in a negative, non-zero voltage state in response to the first control signal in the second, zero-voltage state.

In Aspect 31, the generating a second control signal with a zero voltage state in response to the first control signal in the positive first non-zero state any one or more of Aspects 1-30 optionally includes coupling a first voltage divider to a positive supply voltage, and isolating a second voltage divider from the positive supply voltage.

In Aspect 32, the generating a second control signal with a zero voltage state in response to the first control signal in the positive first non-zero state any one or more of Aspects 1-31 optionally includes comparing a voltage of a first intermediate node of the first voltage divider with a voltage of a second intermediate node of the second voltage divider to provide a first comparison, and coupling an output of the level shift circuit to a zero voltage supply in response to the first comparison.

In Aspect 33, the generating the second control signal in a negative, non-zero voltage state in response to the first control signal in the second, zero-voltage state any one or more of Aspects 1-32 optionally includes coupling the second voltage divider to a positive supply voltage, and isolating the first voltage divider from the positive supply voltage.

In Aspect 34, the generating the second control signal in a negative, non-zero voltage state in response to the first control signal in the second, zero-voltage state any one or more of Aspects 1-33 optionally includes comparing a voltage of a first intermediate node of the first voltage divider with a voltage of a second intermediate node of the second voltage divider to provide a second comparison, and coupling an output of the level shift circuit to a negative, non-zero voltage supply in response to the second comparison.

In Aspect 35, a method of operating a pass gate circuit, the pass gate circuit configured to pass a first signal from a first node of the pass gate circuit to a second node of the pass gate circuit in a first state, and to isolate the first signal at the first node from the second node in a second state, can include receiving a control signal in a first, positive, non-zero voltage state at a control node of a pass gate transistor, passing the first signal from the first node to the second node in response to the receiving the first state of the control signal, receiving the control signal in a second, negative, non-zero voltage state at the control node of a pass gate transistor, isolating the first signal from the second node in response to the receiving the second state of the control signal, coupling the first signal to the control node using a first capacitor, and in response to receiving the second state of the control signal, selectively coupling the control node with ground via a second capacitor to mitigate effects of the coupling the first signal to the control node via the first capacitor.

In Aspect 36, a system an include an antenna array, and a plurality of power amplifiers coupled to the antenna array, each power amplifier configured to transmit a wireless signal according to a wireless protocol different than a wireless protocol used for the other power amplifiers, and a fan-out circuit configured to receive a signal for transmission, to receive a plurality of command signals, and to route the signal to a selected one of the power amplifiers of the plurality of power amplifiers based on a state of the plurality of command signals.

In Aspect 37, the fanout circuit any one or more of Aspects 1-36 optionally includes a balun configured to receive the signal for transmission at an input and to provide a representation of the signal at an output, and a plurality of pass gate circuits coupled to the balun, each pass gate circuit configured to receive the representation of the signal at a first node, to receive a control signal at a second node; to pass the representation of the signal to a third node when the control signal is in a first state; and to isolate the representation of the signal from the third node when the control signal is in a second state.

In Aspect 38, the first state of the control signal any one or more of Aspects 1-37 optionally includes a non-zero voltage, and the second state of the control signal includes the non-zero voltage with a polarity opposite the non-zero voltage of the first state.

In Aspect 39, a first pass gate circuit any one or more of Aspects 1-38 optionally includes a first transistor, and the second node of the first pass gate circuit optionally includes a control node of the first transistor.

In Aspect 40, the first pass gate circuit any one or more of Aspects 1-39 optionally includes a second transistor, the second transistor having a control node, and first and second switch nodes. The first switch node of the second transistor is coupled to the second node, and the control node of the second transistor is coupled to a reference voltage, the reference voltage having a value between the non-zero voltage of the first state and the non-zero voltage of the second state.

In Aspect 41, the first pass gate circuit any one or more of Aspects 1-40 optionally includes a first capacitor, the first capacitor coupled between the second switch node of the second transistor and the reference voltage.

In Aspect 42, the first pass gate circuit any one or more of Aspects 1-41 optionally includes a second capacitor coupled between the first node of the first pass gate circuit and the second node of the first pass gate circuit.

In Aspect 43, a system can include means for wirelessly transmitting a first signal including modulated information, a plurality of amplifying means coupled to the means for wirelessly transmitting the first signal, and means for fanning-out a second signal to the plurality of amplifying means, wherein the second signal is a representation of the first signal.

In Aspect 44, the means for wirelessly transmitting any one or more of Aspects 1-43 optionally includes an antenna, and the plurality of amplifying means any one or more of Aspects 1-43 optionally includes a power amplifier.

In Aspect 45, the means for fanning-out any one or more of Aspects 1-44 optionally includes a balun configured to receive the signal for transmission at an input and to provide a representation of the signal at an output, and a plurality of pass gate circuits coupled to the balun, each pass gate circuit configured to receive the representation of the signal at a first node, to receive a control signal at a second node; to pass the representation of the signal to a third node when the control signal is in a first state; and to isolate the representation of the signal from the third node when the control signal is in a second state, wherein the first state of the control signal includes a non-zero voltage, wherein the second state of the control signal includes the non-zero voltage with a polarity opposite the non-zero voltage of the first state, wherein a first pass gate circuit includes a first transistor, wherein the second node of the first pass gate circuit includes a control node of the first transistor, wherein the first pass gate circuit includes a second transistor, the second transistor having a control node, and first and second switch nodes, wherein the first switch node of the second transistor is coupled to the second node, wherein the control node of the second transistor is coupled to a reference voltage, the reference voltage having a value between the non-zero voltage of the first state and the non-zero voltage of the second state, wherein the first pass gate circuit includes a first capacitor, the first capacitor coupled between the second switch node of the second transistor and the reference voltage, and wherein the first pass gate circuit includes a second capacitor coupled between the first node of the first pass gate circuit and the second node of the first pass gate circuit.

In Aspect 46, the means for fanning-out any one or more of Aspects 1-45 optionally includes a means for level shifting the control signal.

In Aspect 47, the means for level shifting of any one or more of Aspects 1-46 optionally includes a first voltage divider circuit, wherein a first end of the first voltage divider circuit is coupled to a negative voltage supply, a second voltage divider circuit, wherein a first end of the second voltage divider circuit is coupled to the negative voltage supply, a first switch configured to couple a second end of the first voltage divider to a positive supply voltage when a command signal is in a first state, a second switch configured to couple a second end of the second voltage; divider to the positive supply voltage when the command signal is in a second state, and wherein the means for level shifting is configured to receive the command signal, wherein the command signal includes a positive voltage first state and a zero-voltage second state, and wherein the means for level shifting is configured to provide an output signal having a reference voltage third state of the control signal responsive to the positive voltage first state of the command signal, and a negative voltage fourth state of the control signal responsive to the zero-voltage second state of the commend signal.

The above detailed description includes references to the accompanying drawings, which form a part of the detailed description. The drawings show, by way of illustration, specific aspects in which the invention can be practiced. These aspects are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect, and it is contemplated that such aspects can be combined with each other in various combinations or permutations. The scope of the invention should be determined with reference to the appended claims, along with the full scope of equivalents to which such claims are legally entitled.

What is claimed is:

1. A pass gate circuit configured to pass a received RF signal received at a first node to a second node when a control signal is in a first state, and to isolate the second node from the first node when the control signal is in a second state, the pass gate circuit comprising;
   a first transistor having a control node and first and second switch nodes, the first node including the first switch node, and the second node including the second switch node;
   an isolation element coupled to the control node of the first transistor, the isolation element configured to receive the control signal;
   a second transistor;
   a first capacitor selectively coupled between the control node and a reference voltage via operation of the second transistor; and
   a second capacitor coupled between the first node and the control node of the first transistor;
   wherein the second transistor has a first switch node coupled to the control node of the first transistor, a second switch node coupled to the first capacitor, and a control node coupled to the reference voltage,
   wherein the isolation element and the second capacitor allow the control node of the first transistor to maintained a consistent bias above the received RF signal, and
   wherein the reference voltage is less than a first voltage of the control signal in the first state and greater than a second voltage of the control signal in the second state.

2. The pass gate circuit of claim 1, wherein the first voltage is a non-zero voltage and the second voltage is the non-zero voltage with opposite polarity.

3. The pass gate circuit of claim 2, wherein the first voltage is about +1.2 Volts.

4. The pass gate circuit of claim 1, wherein the first transistor is an NMOS transistor.

5. A pass gate circuit configured to pass a signal received at a first node to a second node when a control signal is in a first state, and to isolate the second node from the first node when the control signal is in a second state, the pass gate circuit comprising;
   a first transistor having a control node and first and second switch nodes, the control node configured to receive the control signal, the first node including the first switch node, and the second node including the second switch node;
   a first capacitor selectively coupled between the control node and a reference voltage; and
   a second transistor having a first switch node coupled to the control node of the first transistor, a second switch node coupled to the first capacitor, and a control node coupled to the reference voltage,
   wherein the reference voltage is less than a first voltage of the control signal in the first state and greater than a second voltage of the control signal in the second state, and
   wherein the second transistor is an NMOS transistor.

6. The pass gate circuit of claim 5, including a second capacitor coupled between the first node and the control node of the first transistor.

* * * * *

UNITED STATES PATENT AND TRADEMARK OFFICE
CERTIFICATE OF CORRECTION

PATENT NO. : 11,632,108 B2
APPLICATION NO. : 17/669762
DATED : April 18, 2023
INVENTOR(S) : Yu et al.

It is certified that error appears in the above-identified patent and that said Letters Patent is hereby corrected as shown below:

In the Claims

In Column 17, Line 21, In Claim 1, delete "comprising;" and insert --comprising:-- therefor In Column 18, Line 18, In Claim 5, delete "comprising;" and insert --comprising:-- therefor Signed and Sealed this
Thirteenth Day of August, 2024

Katherine Kelly Vidal
*Director of the United States Patent and Trademark Office*